United States Patent
Gilliland et al.

(10) Patent No.: US 9,767,861 B2
(45) Date of Patent: Sep. 19, 2017

(54) REGULATED VOLTAGE SUPPLY WITH LOW POWER CONSUMPTION AND SMALL CHIP AREA

(71) Applicant: Synopsys, Inc., Mountain View, CA (US)

(72) Inventors: Troy N. Gilliland, Bellevue, WA (US); Yanyi Liu Wong, Bellevue, WA (US)

(73) Assignee: Synopsys, Inc., Mountain View, CA (US)

( * ) Notice: Subject to any disclaimer, the term of this patent is extended or adjusted under 35 U.S.C. 154(b) by 37 days.

(21) Appl. No.: 14/811,680

(22) Filed: Jul. 28, 2015

(65) Prior Publication Data

US 2017/0033687 A1    Feb. 2, 2017

(51) Int. Cl.
  *G05F 3/16*    (2006.01)
  *G11C 5/14*    (2006.01)

(52) U.S. Cl.
  CPC ............... *G11C 5/147* (2013.01); *G05F 3/16* (2013.01)

(58) Field of Classification Search
  None
  See application file for complete search history.

(56) References Cited

U.S. PATENT DOCUMENTS

| | | | | |
|---|---|---|---|---|
| 5,262,871 A | * | 11/1993 | Wilder | H01L 27/14609 257/E27.132 |
| 6,160,392 A | * | 12/2000 | Shin | G05F 3/242 323/284 |
| 7,969,191 B2 | | 6/2011 | Nedalgi | |
| 2007/0046387 A1 | * | 3/2007 | Blum | H03B 5/1228 331/117 FE |
| 2008/0007338 A1 | | 1/2008 | Jung et al. | |
| 2016/0126970 A1 | * | 5/2016 | Xu | H03M 1/1023 341/118 |

OTHER PUBLICATIONS

Leo, C.J. et al., "An Ultra Low-Power Capacitor-Less LDO with High PSR," 2013 IEEE MTT-S International Microwave Workshop Series on RF and Wireless Technologies for Biomedical and Healthcare Applications (IMWS-BIO), IEEE, 2013, 3 pages.

* cited by examiner

*Primary Examiner* — Jeffrey Gblende
(74) *Attorney, Agent, or Firm* — Fenwick & West LLP (57) ABSTRACT

A circuit provides a regulated voltage supply for other circuits. The circuit includes a bias current source and a reference voltage source. The circuit includes a pass transistor and a feedback transistor. The pass transistor receives input from the feedback transistor that generates a regulated voltage at a terminal of the pass transistor. The feedback transistor receives inputs from the regulated voltage of the pass transistor and the reference voltage source. The feedback transistor provides voltage for the input of the pass transistor, thereby controlling the regulated voltage generated by the pass transistor. The regulated voltage generated by the pass transistor is provided as a regulated voltage supply to other circuits.

20 Claims, 5 Drawing Sheets

REGULATED VOLTAGE SUPPLY WITH LOW POWER CONSUMPTION AND SMALL CHIP AREA

BACKGROUND

1. Field of the Disclosure

The present disclosure relates to circuits for generating regulated voltage supply that consume low power and occupy small area of an integrated circuit.

2. Description of the Related Art

Battery life is a significant consideration for several electronic applications, for example, RFID (radio-frequency identification) applications, NFC (near field communications), and IoT (internet of things.) As a result, low power electronic circuits are designed for such applications. However, to ensure proper operation of the circuits, the voltage supply for these circuits needs to be regulated against variations such as process and temperature.

Conventional circuits for generating regulated voltage typically use complex voltage reference and regulator circuits that use operational amplifiers and voltage reference circuits. Such complex circuits can occupy significant amount of area of an integrated circuit chip. Furthermore, these complex circuits consume significant power. Therefore, conventional circuits for providing regulated voltage are often inadequate for low power applications.

SUMMARY

Embodiments relate to a simple voltage regulator circuit that uses only four devices. The voltage supply of the voltage regulator circuit is regulated against manufacturing process and temperature variations. The simplified configuration of the voltage regulator circuit results in low power consumption and use of a small chip area. The voltage regulator circuit includes a bias current source connected to a first supply voltage. The voltage regulator circuit further includes a reference voltage source that sets a reference voltage level at a reference terminal. The voltage regulator circuit includes a pass transistor and a feedback transistor, each transistor having a first terminal, a second terminal, and an input terminal. The input terminal of the pass transistor controls the current through the pass transistor from the first terminal to the second terminal. The first terminal of the pass transistor is connected to a second supply voltage. The second terminal of the pass transistor provides input voltage to the feedback transistor. The pass transistor provides a regulated output voltage at the second terminal. The input terminal of the feedback transistor is connected to the second terminal of the pass transistor. The second terminal of the feedback transistor receives reference voltage from the reference voltage source. The first terminal of the feedback transistor is connected to the bias current source for receiving the bias current. The feedback transistor generates feedback voltage and provides the feedback voltage as input to the pass transistor. The feedback voltage received as input by the pass transistor controls the regulated output voltage generated at the second terminal of the pass transistor. The regulated output voltage can be provided as supply voltage for another circuit, for example, a memory circuit.

In an embodiment, the pass transistor and the feedback transistors are NMOS FETs (n-type metal oxide semiconductor field effect transistors.) The bias current source can be any one of a PMOS FET (p-type metal oxide semiconductor field effect transistor), a diode, or a resistor. Similarly, the reference voltage source can be any one of a PMOS FET, a diode, or a resistor.

In an embodiment, one or both of the pass transistor and the feedback transistor are depletion mode devices (i.e., native devices.)

In an embodiment, the first supply voltage is same as the second supply voltage.

BRIEF DESCRIPTION OF THE DRAWINGS

The teachings of the embodiments can be readily understood by considering the following detailed description in conjunction with the accompanying drawings.

DETAILED DESCRIPTION

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
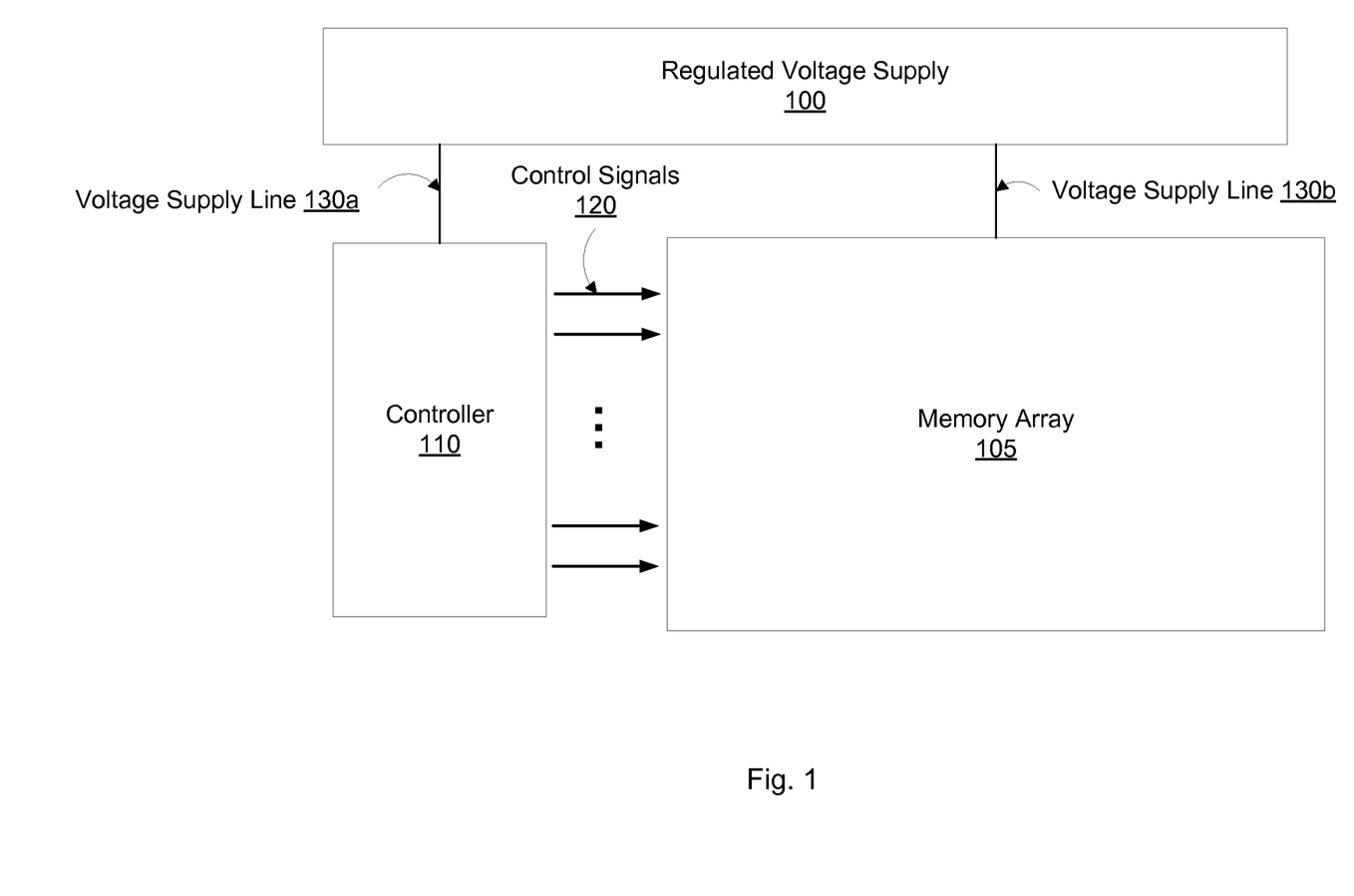
FIG. 1 is a block diagram illustrating a memory circuit receiving voltage from a regulated voltage supply, according to an embodiment.

FIG. 1 is a block diagram illustrating a memory circuit receiving voltage from a regulated voltage supply 100, according to an embodiment. The circuit shown in FIG. 1 includes a memory array 105. Controller 110 provides control signals 120 for controlling the operation of the memory array 105. The control signal 120 instructs reading of data from the memory array 105 and writing of data into the memory array 105. The regulated voltage supply 100 provides voltage supply to the controller 110 via the voltage supply line 130a and to the memory array 105 via the voltage supply line 130b. The regulated voltage supply 100 is regulated against process and temperature variations. Various embodiments of circuits implementing the regulated voltage supply 100 are described herein. The configuration shown in FIG. 1 may be used in applications including RFID applications, NFC, and IoT.

Figure 2:
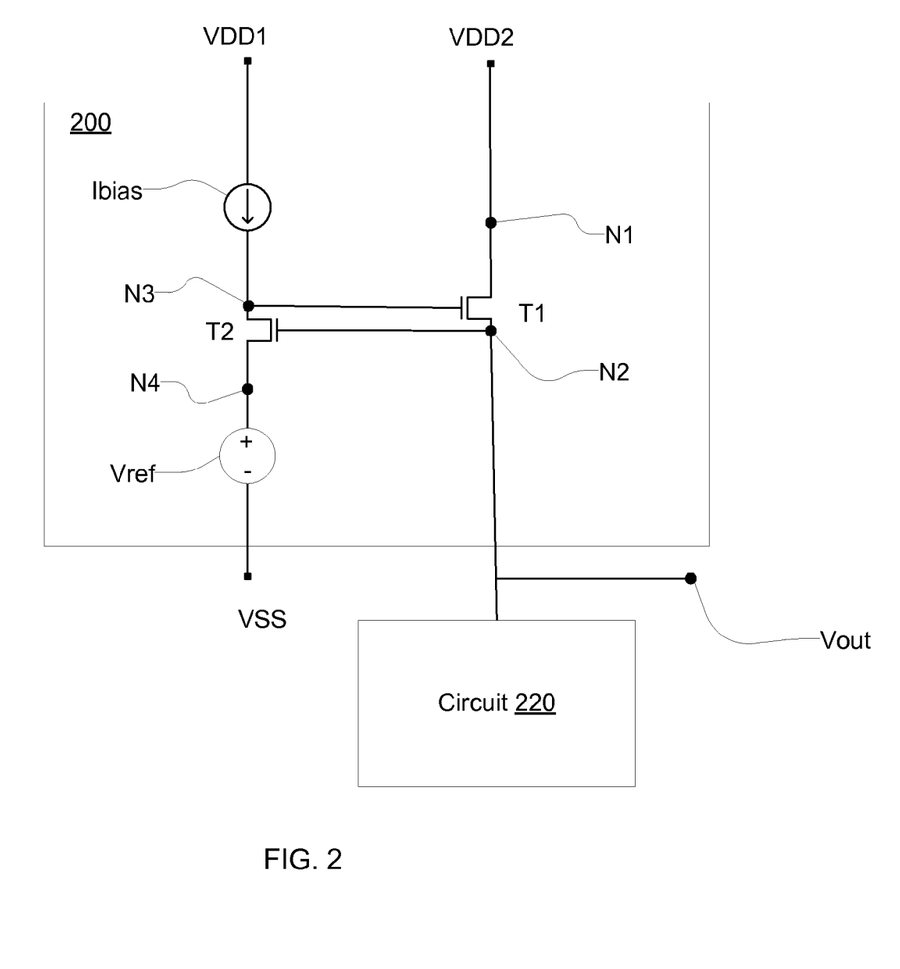
FIG. 2 is a circuit diagram illustrating main components of a regulated voltage supply, according to an embodiment.

FIG. 2 is a diagram of a circuit 200 illustrating the main components of a regulated voltage supply 100, according to an embodiment. The circuit 200 shown in FIG. 2 includes a pass transistor T1, a feedback transistor T2, a reference voltage source Vref, and a bias current source Ibias. The circuit 200 includes nodes N1, N2, N3, and N4. A node represents a net that connects terminals of two or more devices or a terminal of a device with a voltage supply or another circuit element. The components of circuit 200 are connected to voltage supplies VDD1 and VDD2 and ground voltage VSS. In an embodiment, the voltage supplies VDD1 and VDD2 are identical.

As shown in FIG. 2, transistors T1 and T2 are NMOS FETs (n-type Metal Oxide Semiconductor Field Effect Transistor). In other embodiments, T1 and T2 may be other types of transistors, for example, PMOS FETs or BJTs (bipolar junction transistors).

Each of the transistors T1, T2 has a first terminal, a second terminal, an input terminal. Certain transistors, for example, MOSFET transistors have a fourth terminal (also called a substrate terminal) connected to the substrate of the device. If a transistor is an NMOS FET, the first terminal is the drain of the transistor, the second terminal is the source of the transistor, and the input terminal is the gate of the transistor. If the transistor is a PMOS FET, the first terminal is the source of the transistor, the second terminal is the drain of the transistor, and the input terminal is the gate of the transistor. FIG. 2 shows only three of the terminals for each of the transistors, i.e., the first terminal, the second terminal, and the input terminal.

The bias current source Ibias connects the voltage supply VDD1 with the drain of the NMOS FET T2 and controls the current passing through the NMOS FET T2. The bias current source Ibias can be a transistor, for example, a PMOS FET, a diode, or a resistor.

The circuit shown in FIG. 2 shows a reference voltage source Vref connected to the source of the NMOS FET T2 via node N4. The reference voltage source Vref may be implemented, for example, using a PMOS FET, a diode, or a resistor. The reference voltage source Vref determines the value of the voltage generated at the drain of NMOS FET T2. For example, if V1 represents the voltage at the drain of the NMOS FET T2, the value of V1 can expressed using the following equation:

$$V1 \sim (Vin - Vout) * g_{m1} * r_{out} \quad (1)$$

In equation (1), Vin represents the reference voltage at the source of NMOS FET T2, Vout represents the voltage at the gate of NMOS FET T2, $g_{m1}$ represents a measure of transconductance of the NMOS FET T2, and $r_{out}$ represents the output resistance of the NMOS FET T2. According to equation (1), the voltage V1 at node N3 depends on the difference between Vin and Vout. The reference voltage source Vref provides the voltage Vin at the node N4 connected to the source of the NMOS FET T2, thereby controlling the voltage V1 at the drain of the NMOS FET T2. The ~ sign in an equation indicates that the variable on the left hand side is substantially equal to the expression following the ~ sign. There are factors other than those indicated in the above equation that determine the exact value of V1. However, these are secondary factors and their effect on the value of V1 is small.

The source of the NMOS FET T1 provides a regulated voltage at node N2. The source of the NMOS FET T1 is connected to the input terminal of the feedback transistor T2 via node N2. The drain of the NMOS FET T2 is connected to node N3 which is connected to the gate of the NMOS FET T1. The source of the NMOS FET T1 provides a voltage input at the gate of the NMOS FET T2 via node N2 and therefore, controls the voltage at the drain of the NMOS FET T2. The drain of the NMOS FET T2 in turn provides feedback to the gate of the NMOS FET T1 via node N3. As shown by equation (1), if Vout increases, V1 decreases, thereby reducing the voltage at the gate of NMOS FET T1. Such reduction in the voltage at the gate of NMOS FET T1 prevents the voltage of Vout from increasing. Similarly, if Vout decreases, the value of V1 increases according to equation (1), thereby increasing the voltage at the gate of NMOS FET T1. This prevents the decrease in the value of Vout. Accordingly, NMOS FET T2 provides negative feedback to NMOS FET T1 and maintains a stable value of the regulated output voltage Vout.

The source of the NMOS FET T2 is connected to node N4. Node N4 is connected to the reference voltage source Vref. The reference voltage source Vref is fabricated using the same process as the transistors T1 and T2. Therefore, the reference voltage source Vref allows the regulated output voltage Vout to track process parameters, for example, threshold voltages of transistors over temperature. The source of the NMOS FET T1 provides a regulated voltage at Vout. The regulated voltage source output Vout can be provided as a voltage supply to any other circuit 220 (for example, the memory array 105 shown in FIG. 1). The circuit 200 shown in FIG. 2 consists essentially of four devices. The simple configuration of the circuit 200 results in low power consumption and use of a small chip area.

Figure 3:
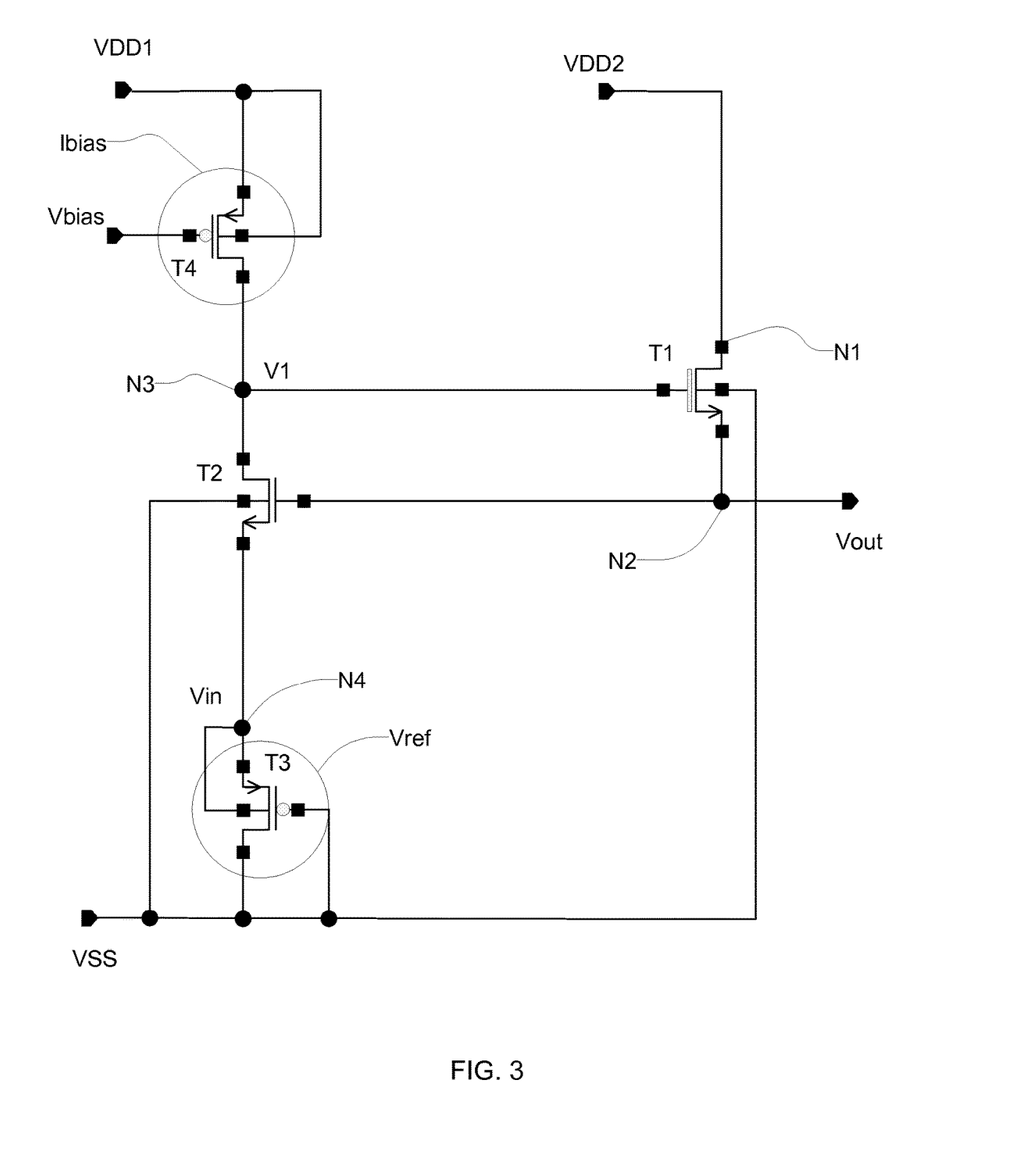
FIG. 3 is a detailed diagram of a circuit of a regulated voltage supply, according to an embodiment.

FIG. 3 is a detailed diagram of a circuit of a regulated voltage supply, according to an embodiment. The NMOS FETs T1 and T2 shown in FIG. 3 correspond to the NMOS FETs T1 and T2 respectively shown in FIG. 2. FIG. 3 shows connections of the substrate terminals of various transistors. The substrate of NMOS FET T1 is connected to the ground voltage VSS. The substrate of NMOS FET T2 is also connected to the ground voltage VSS.

The embodiment shown in FIG. 3 uses a PMOS FET T3 as the reference voltage source Vref. The drain and the gate of the PMOS FET T3 are connected to the ground voltage VSS. The source of the PMOS FET T3 is connected to the source of the feedback NMOS FET T2 via node N4. The substrate of the PMOS FET T3 is connected to the source of the PMOS FET T3 via node N4. The source of the PMOS FET T3 provides the reference voltage Vin for the NMOS FET T2 via node N4.

The embodiment shown in FIG. 3 uses PMOS FET T4 as a bias current source. The source of the PMOS FET T4 is connected to the voltage supply VDD1. The drain of the PMOS FET T4 is connected to the drain of the NMOS FET T2 via node N3. The substrate of the PMOS FET T4 is connected to the supply voltage VDD1. The gate of the PMOS FET T4 receives voltage Vbias which controls the bias current through the PMOS FET T4. In an embodiment, a voltage supply circuit provides the voltage Vbias. The value of Ib needed to provide a particular value of Vout is determined based on equation (2) below. The voltage supply circuit is adjusted to provide a voltage Vbias that causes the determined current Ib to pass via the current source Ibias.

In other embodiments, transistors T1 and T2 are PMOS FETs and the reference voltage supply Vref and the bias current source Ibias are implemented using NMOS FETs. The reference voltage supply Vref and the bias current source Ibias may alternatively be implemented using resistors or diodes.

Use of PMOS FET T3 as a reference voltage source allows the generated regulated voltage supply Vout to track process parameters over temperature. The relation between Vout and various process parameters can be expressed in the following equation:

$$Vout \sim Vthp + Vthn + sqrt[2 * I_b / (\mu * C_{ox}(W/L))] \quad (2)$$

where Vthp represents the threshold voltage of the PMOS FET T3, Vthn represents the threshold voltage of the NMOS FET T2, $I_b$ represents the bias current provided by the bias current source Ibias, $\mu_n$ represents a measure of mobility of electrons of NMOS FET T1, $C_{ox}$ represents gate-oxide capacitance of NMOS FET T1, W represents the gate width of NMOS FET T1, L represents the gate length of NMOS FET T1, and sqrt is the square root function. Accordingly, the value of the Vout depends on the threshold voltages Vthp and Vthn. Therefore, Vout tracks the various process parameters, for example, threshold voltages of transistors over temperature in accordance with equation (2).

Typically, the NMOS FETs T1 and T2 are enhancement mode devices. However, in some embodiments, one or more of the NMOS FETs T1 and T2 are depletion mode devices, also referred to as native NMOS devices. Depletion mode devices have a very low threshold voltage. In other words, the value of Vthn is close to zero. Accordingly, for these embodiments, equation (2) is modified as follows:

$$Vout = Vthp + sqrt[2 * I_b / (\mu * C_{ox}(W/L))] \quad (3)$$

One of many advantages of using depletion mode devices is that a very low operating range of the regulated output voltage Vout can be achieved.

Figure 4:
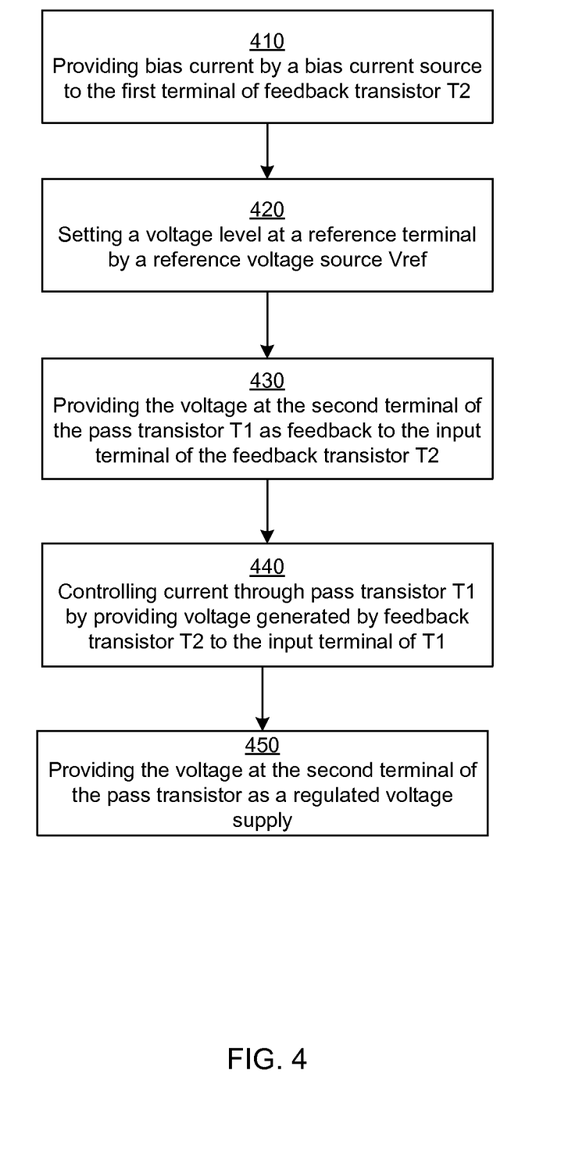
FIG. 4 is a flowchart illustrating the process of generating a regulated voltage, in accordance with an embodiment.

FIG. 4 is a flowchart illustrating the process of generating a regulated voltage, in accordance with an embodiment. The voltage regulator circuit comprises a pass transistor, for example, NMOS FET T1, a feedback transistor, for example, NMOS FET T2, a bias current source Ibias, and a reference voltage source Vref, as described above with reference to FIGS. 2 and 3. Each transistor has a first terminal (for example, drain of an NMOS FET), a second terminal (for example, source of an NMOS FET), and an input terminal (for example, gate.)

The bias current source Ibias provides 410 bias current to the first terminal of the feedback transistor T2. A reference voltage source Vref sets 420 the reference voltage at a reference terminal connected to the second terminal of the feedback transistor T2. The pass transistor T1 provides 430 the voltage at the second terminal of the pass transistor T1 as feedback to the input terminal (i.e., the gate) of the feedback transistor T2. The feedback transistor T2 controls 440 the current through the pass transistor T1 by providing the voltage generated at the first terminal of the feedback transistor T2 as input to the input terminal of the pass transistor T1. The pass transistor T1 provides 450 the voltage generated at the second terminal of the pass transistor T1 as the regulated voltage supply for another circuit, for example, circuit 220.

The steps indicated in FIG. 4 may be performed in an order different from that indicated in FIG. 4. For example, steps 410 and 420 may be performed concurrently. Similarly, steps 430 and 440 may be performed concurrently.

Figure 5:
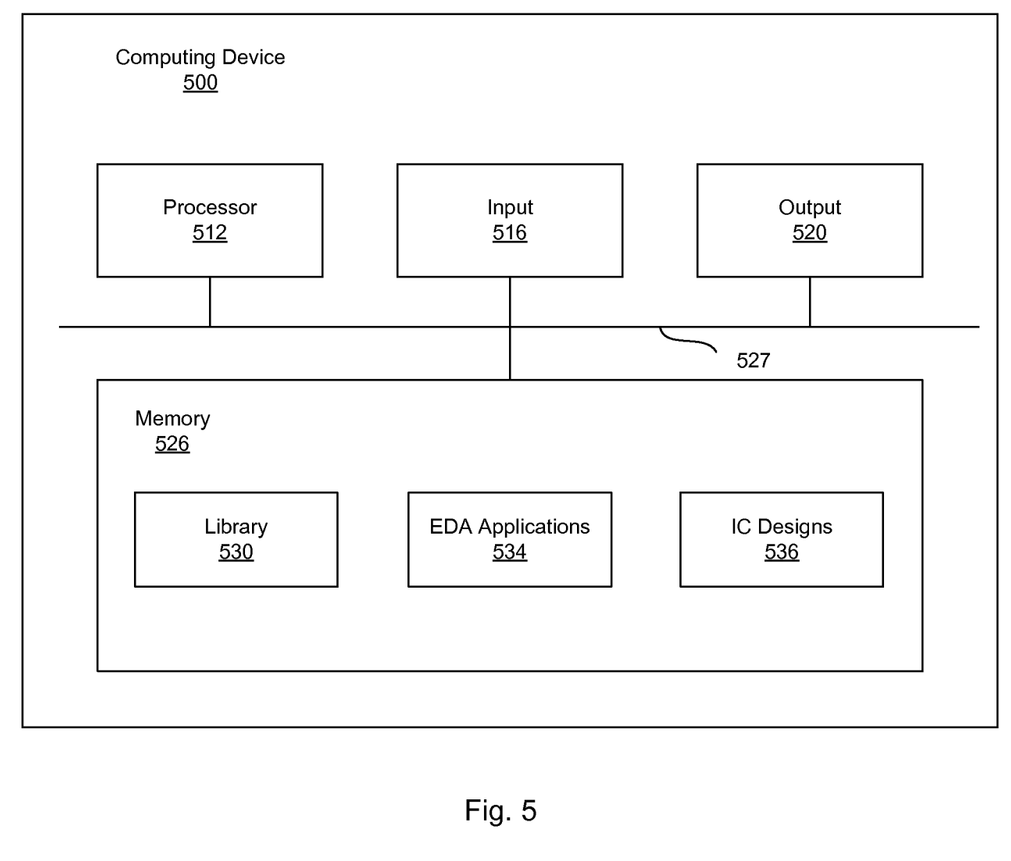
FIG. 5 is a block diagram of a computing device for performing design operations associated with an integrated circuit including a regulated voltage supply circuit, according to an embodiment.

FIG. 5 is a block diagram of a computing device for performing design operations associated with an integrated circuit including a regulated voltage supply circuit, according to an embodiment. The computer device 500 may include, among other components, a processor 512, an input module 516, an output module 520, a memory 526 and a bus for connecting these components. The processor 512 executes instructions stored in the memory 526. The input module 516 may include various devices for receiving user input, including keyboards and pointing devices (e.g., mouse and touch screen). The output module 520 includes a display device or interface device for communicating with the display device.

The memory 526 is a non-transitory computer readable storage medium storing, among others, library 530, electronic design automation (EDA) applications 534 and integrated circuit (IC) designs 536. The library 530 may include data on various circuit components, including instances of voltage regulator circuits describe herein. The EDA applications 534 may include various software programs for designing ICs, including place and route tools, synthesis tools, and verification tools. The design processed by the EDA applications 534 may be stored in IC designs 536. The IC designs 536 may be an entire operational circuit or a part of a larger IC circuit.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A voltage regulator circuit, consisting essentially of:
   a bias current source connected to a first supply voltage and configured to provide a bias current;
   a reference voltage source having a reference terminal, the reference voltage source configured to set a reference voltage at the reference terminal;
   a pass NMOS FET (n-type metal oxide semiconductor field effect transistor) having a drain connected to a second supply voltage, a gate controlling a current through the pass NMOS FET from the drain to a source of the pass NMOS FET, and a source providing a regulated output voltage; and
   a feedback NMOS FET having a drain connected to the bias current source to receive the bias current, a source connected to the reference terminal for receiving the reference voltage from the reference voltage source, a gate connected to the source of the pass NMOS FET for receiving input voltage for the feedback NMOS FET, the drain of the feedback NMOS FET connected to the gate of the pass NMOS FET, the feedback NMOS FET providing feedback voltage to the gate of the pass NMOS FET.

2. The circuit of claim 1, wherein the bias current source is one of a PMOS FET (p-type metal oxide semiconductor field effect transistor), a diode, or a resistor.

3. The circuit of claim 1, wherein the reference voltage source is one of a PMOS FET, a diode, or a resistor.

4. The circuit of claim 1, wherein one or more of the pass NMOS FET or the feedback NMOS FET are depletion mode devices.

5. The circuit of claim 1, wherein the voltage regulator circuit is connected to another circuit via the source of the pass NMOS FET for providing regulated voltage supply to the other circuit.

6. A voltage regulator circuit, consisting essentially of:
   a bias current source connected to a first supply voltage and configured to provide a bias current;
   a reference voltage source having a reference terminal, the reference voltage source configured to set a reference voltage level at the reference terminal;
   a pass transistor having a first terminal connected to a second supply voltage, an input terminal controlling a current through the pass transistor from the first terminal to a second terminal of the pass transistor, the second terminal of the pass transistor providing a regulated output voltage; and a feedback transistor having a first terminal connected to the bias current source to receive the bias current, a second terminal connected to the reference terminal for receiving the reference voltage from the reference voltage source, and an input terminal connected to the second terminal of the pass transistor to receive input voltage for the feedback transistor, the first terminal of the feedback transistor connected to the input terminal of the pass transistor, the feedback transistor generating a feedback voltage provided as input to the input terminal of the pass transistor, wherein an increase in voltage of the input terminal of the feedback transistor causes a decrease in the voltage of the first terminal of the feedback transistor and a decrease in the voltage of the input terminal of the pass transistor modifies a current flowing through the pass transistor to prevent the voltage of the second terminal of the pass transistor from increasing.

7. The circuit of claim 6, wherein the bias current source is one of a transistor, a diode, or a resistor.

8. The circuit of claim 6, wherein the reference voltage source is one of a transistor, a diode, or a resistor.

9. The circuit of claim 6, wherein one or more of the pass transistor and the feedback transistor are depletion mode devices.

10. The circuit of claim 6, wherein the voltage regulator circuit is connected to another circuit via the second terminal of the pass transistor for providing regulated voltage supply to the other circuit.

11. A method of regulating voltage, the method consisting essentially of:
providing bias current by a bias current source connected to a first supply voltage to a first terminal of a feedback transistor;
setting a voltage level at a reference terminal by a reference voltage source;
providing voltage of the reference terminal to a second terminal of the feedback transistor;
providing voltage generated at a second terminal of a pass transistor as input to an input terminal of the feedback transistor, wherein the first terminal of the pass transistor is connected to a second supply voltage;
controlling a current through the pass transistor from the first terminal of the pass transistor to the second terminal of the pass transistor by providing a feedback voltage generated by the feedback transistor to an input terminal of the pass transistor, wherein an increase in voltage of the input terminal of the feedback transistor causes a decrease in the voltage of the first terminal of the feedback transistor and a decrease in the voltage of the input terminal of the pass transistor modifies a current flowing through the pass transistor to prevent the voltage of the second terminal of the pass transistor from increasing; and
providing voltage generated at the second terminal of the pass transistor as a regulated voltage supply to a circuit.

12. The method of claim 11, wherein the bias current source is one of a transistor, a diode, or a resistor.

13. The method of claim 11, wherein the reference voltage source is one of a transistor, a diode, or a resistor.

14. The method of claim 11, wherein one or more of the pass transistor or the feedback transistor are depletion mode devices.

15. The method of claim 11, wherein the first supply voltage is same as the second supply voltage.

16. A non-transitory computer readable storage medium storing a digital representation of a voltage regulator circuit, the voltage regulator circuit consisting essentially of:
a bias current source connected to a first supply voltage and configured to provide a bias current;
a reference voltage source having a reference terminal, the reference voltage source configured to set a reference voltage level at the reference terminal;
a pass transistor having a first terminal connected to a second supply voltage, an input terminal controlling a current through the pass transistor from the first terminal to a second terminal of the pass transistor, the second terminal of the pass transistor providing a regulated output voltage; and
a feedback transistor having a first terminal connected to the bias current source to receive the bias current, a second terminal connected to the reference terminal for receiving the reference voltage from the reference voltage source, and an input terminal connected to the second terminal of the pass transistor to receive input voltage for the feedback transistor, the first terminal of the feedback transistor connected to the input terminal of the pass transistor, the feedback transistor generating a feedback voltage provided as input to the input terminal of the pass transistor, wherein an increase in voltage of the input terminal of the feedback transistor causes a decrease in the voltage of the first terminal of the feedback transistor and a decrease in the voltage of the input terminal of the pass transistor modifies a current flowing through the pass transistor to prevent the voltage of the second terminal of the pass transistor from increasing.

17. The non-transitory computer readable storage medium of claim 16, wherein the bias current source is one of a transistor, a diode, or a resistor.

18. The non-transitory computer readable storage medium of claim 16, wherein the reference voltage source is one of a transistor, a diode, or a resistor.

19. The non-transitory computer readable storage medium of claim 16, wherein one or more of the pass transistor or the feedback transistor are depletion mode devices.

20. The non-transitory computer readable storage medium of claim 16, wherein the voltage regulator circuit is connected to another circuit via the source of the pass transistor for providing regulated voltage supply to the other circuit.

* * * * *

UNITED STATES PATENT AND TRADEMARK OFFICE
CERTIFICATE OF CORRECTION

Page 1 of 1

PATENT NO. : 9,767,861 B2
APPLICATION NO. : 14/811680
DATED : September 19, 2017
INVENTOR(S) : Troy N. Gilliland and Yanyi Liu Wong It is certified that error appears in the above-identified patent and that said Letters Patent is hereby corrected as shown below:

Claim 15, Line 9: replace "voltage is same as" with -- voltage is the same as --.

Signed and Sealed this
Twelfth Day of June, 2018

Andrei Iancu
*Director of the United States Patent and Trademark Office*